United States Patent
Wang et al.

(10) Patent No.: US 6,541,370 B1
(45) Date of Patent: Apr. 1, 2003

(54) COMPOSITE MICROELECTRONIC DIELECTRIC LAYER WITH INHIBITED CRACK SUSCEPTIBILITY

(75) Inventors: Ming-Tsong Wang, Taipei (TW); Shi-Wei Wang, Taipei (TW); Shin-Kai Chen, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/954,858

(22) Filed: Sep. 17, 2001

(51) Int. Cl.[7] .......................................... H01L 21/4763
(52) U.S. Cl. ...................... 438/624; 438/723; 438/724
(58) Field of Search ................................ 438/622, 624, 438/723, 724

(56) References Cited

U.S. PATENT DOCUMENTS

| | | | |
|---|---|---|---|
| 5,057,897 A | * 10/1991 | Nariani et al. ............... 257/760 |
| 5,306,936 A | * 4/1994 | Goto ........................... 257/324 |
| 5,744,378 A | * 4/1998 | Homma ....................... 438/624 |
| 5,880,519 A | * 3/1999 | Bothra et al. ................ 257/641 |
| 5,946,593 A | * 8/1999 | Saitoh ......................... 438/640 |
| 5,976,993 A | 11/1999 | Ravi et al. ................... 438/788 |
| 6,017,614 A | * 1/2000 | Tsai et al. .................... 438/209 |
| 6,100,137 A | * 8/2000 | Chen et al. .................. 438/253 |
| 6,171,947 B1 | 1/2001 | Pangrle et al. .............. 438/624 |

OTHER PUBLICATIONS

Wolf, S., Silicon Processing for the VLSI Era, vol. 2, Lattice Press, 1999, pp. 273–283.*

* cited by examiner

Primary Examiner—T. N. Quach
(74) Attorney, Agent, or Firm—Tung & Associates

(57) ABSTRACT

Within each of a pair of methods for forming each of a pair of microelectronic fabrications with reduced cracking within each of a pair of silicon oxide dielectric layers there is employed at least one stress reducing layer. The at least one stress reducing layer is formed of a silicon and nitrogen containing dielectric material, such as a silicon nitride dielectric material or a silicon oxynitride dielectric material.

17 Claims, 2 Drawing Sheets

US 6,541,370 B1

COMPOSITE MICROELECTRONIC DIELECTRIC LAYER WITH INHIBITED CRACK SUSCEPTIBILITY

BACKGROUND OF THE INVENTION

1. Field of the Invention

The present invention relates generally to dielectric layers employed within microelectronic fabrications. More particularly, the present invention relates to crack inhibited dielectric layers employed within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions and separations have decreased, it has become increasingly difficult to fabricate within microelectronic fabrications microelectronic dielectric layers with enhanced integrity, and in particular enhanced physical integrity. Microelectronic dielectric layers with enhanced integrity are desirable in the art of microelectronic fabrication insofar as microelectronic dielectric layers with enhanced integrity typically provide microelectronic fabrications with enhanced performance and enhanced reliability.

It is thus desirable in the art of microelectronic fabrication to provide within microelectronic fabrications microelectronic dielectric layers with enhanced integrity.

It is towards the foregoing object that the present invention is directed.

Various methods have been disclosed in the art of microelectronic fabrication, for forming, with desirable properties, microelectronic dielectric layers within microelectronic fabrications.

Included among the methods, but not limited among the methods, are methods disclosed within: (1) Ravi et al., in U.S. Pat. No. 5,976,993 (a method for reducing intrinsic stress within a high density plasma chemical vapor deposition (HDP-CVD) deposited dielectric layer within a microelectronic fabrication by cycling within a high density plasma chemical vapor deposition (HDP-CVD) method when forming the high density plasma chemical vapor deposition (HDP-CVD) deposited dielectric layer a bias power); and (2) Pangrle et al., in U.S. Pat. No. 6,171,947 (a method for inhibiting stress induced patterned conductor layer/dielectric layer voiding within a microelectronic fabrication by employing a silicon oxynitride liner layer formed upon a patterned conductor layer prior to forming thereupon a gap filling silicon oxide layer).

Desirable in the art of microelectronic fabrication are additional methods for forming within microelectronic fabrications microelectronic dielectric layers with enhanced integrity.

It is towards the foregoing object that the present invention is directed.

SUMMARY OF THE INVENTION

A first object of the present invention is to provide a method for forming a dielectric layer within a microelectronic fabrication.

A second object of the present invention is to provide a method in accord with the first object of the present invention, wherein the dielectric layer is formed with enhanced integrity.

A third object of the present invention is to provide a method in accord with the first object of the present invention and the second object of the present invention, wherein the method is readily commercially implemented.

In accord with the objects of the present invention, there is provided by the present invention a pair of methods for forming a pair of dielectric layers within a pair of microelectronic fabrications.

To practice a first of the methods of the present invention, there is first provided a substrate. There is then formed upon the substrate a pair of horizontally spaced topographic features. There is then formed upon exposed portions of the substrate and the pair of horizontally spaced topographic features a conformal silicon oxide liner layer formed employing a chemical vapor deposition (CVD) method selected from the group consisting of low pressure thermal chemical vapor deposition (LPCVD) methods and plasma enhanced chemical vapor deposition (PECVD) methods. There is also formed over the conformal silicon oxide liner layer a gap filling silicon oxide layer formed employing a method selected from the group consisting of sub-atmospheric chemical vapor deposition (SACVD) methods, atmospheric pressure chemical vapor deposition (APCVD) methods and spin-on methods. There is also formed over the gap filling silicon oxide layer a capping silicon oxide layer formed employing a chemical vapor deposition (CVD) method selected from the group consisting of low pressure thermal chemical vapor deposition (LPCVD) methods and plasma enhanced chemical vapor deposition (PECVD) methods. Finally, there is also formed at least either: (1) interposed between the conformal silicon oxide liner layer and the gap filling silicon oxide layer; (2) interposed between the gap filling silicon oxide layer and the capping silicon oxide layer; or (3) upon the capping silicon oxide layer, at least one stress reducing layer, wherein the at least one stress reducing layer is formed of a silicon and nitrogen containing dielectric material.

In accord with a second embodiment of the present invention, there is also first provided a substrate having formed thereupon a pair of horizontally spaced topographic features. However, within the second embodiment of the present invention there is formed upon exposed portions of the substrate and the pair of horizontally spaced topographic features a passivation silicon oxide layer formed employing a high density plasma chemical vapor deposition (HDP-CVD) method. Finally, within the second embodiment of the present invention, there is formed upon the passivation silicon oxide layer a stress reducing layer formed of a silicon and nitrogen containing dielectric material.

The present invention provides a pair of methods for forming a pair of dielectric layers within a pair of microelectronic fabrications, wherein the pair of dielectric layers is formed with enhanced integrity.

The present invention realizes the foregoing object by forming each of the pair of dielectric layers as composite dielectric layers which are otherwise formed of silicon oxide dielectric materials formed at least in part employing chemical vapor deposition (CVD) methods, but having laminated therein at least one stress reducing layer formed of a silicon and nitrogen containing dielectric material. In accord with the present invention, each of the pair of composite dielectric layers so formed exhibits reduced cracking and thus enhanced integrity, due to presence of the stress reducing layers.

The methods of the present invention are readily commercially implemented.

The present invention employs methods and materials as are generally conventional in the art of microelectronic fabrication, but employed within the context of specific structural limitations and specific materials limitations to provide the present invention. Since it is thus at least in part a series of structural limitations and materials limitations which provides at least in part the present invention, rather than the existence of methods and materials which provides the present invention, the methods of the present invention are readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a pair of methods for forming a pair of dielectric layers within a pair of microelectronic fabrications, wherein the pair of dielectric layers is formed with enhanced integrity.

The present invention realizes the foregoing object by forming each of the pair of dielectric layers as a composite dielectric layer, formed primarily of a silicon oxide dielectric material, but laminated with a stress reducing layer formed of a silicon and nitrogen containing dielectric material. Within the present invention, each of the pair of composite dielectric layers exhibits reduced cracking due to the presence of the stress reducing layer.

As is understood by a person skilled in the art, the preferred embodiments of the present invention provide particular value within the context of forming, with enhanced physical integrity as evidenced by reduced cracking, a dielectric layer interposed between a pair of horizontally spaced patterned conductor layers within a semiconductor integrated circuit microelectronic fabrication. However, the present invention may nonetheless also be employed for forming, with enhanced integrity as evidenced by reduced cracking, analogous dielectric layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Similarly, although the preferred embodiments of the present invention illustrate the present invention within the context of enhanced integrity of a dielectric layer formed interposed between a pair of horizontally spaced patterned conductor layers within a semiconductor integrated circuit microelectronic fabrication, the present invention may also be employed to realize an analogous result with respect within a microelectronic fabrication having formed therein a pair of horizontally spaced topographic features selected from the group including but not limited to conductor features (including gate electrodes), semiconductor features and dielectric features.

First Preferred Embodiment

Figure 1:
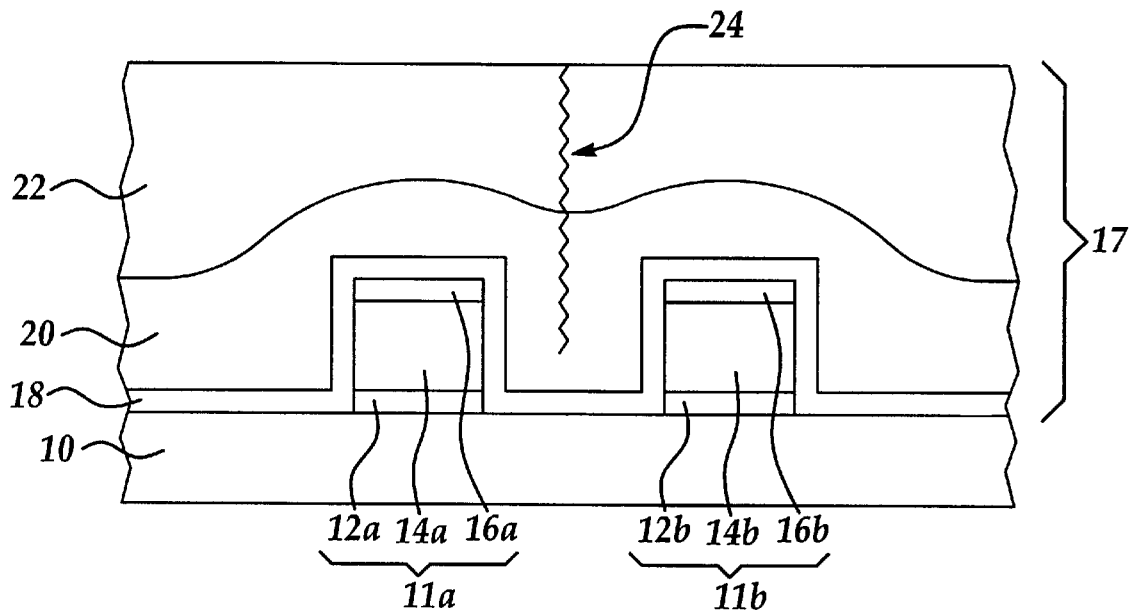
FIG. 1 and FIG. 2 show a pair of schematic cross-sectional diagrams directed towards a first preferred embodiment of the present invention.
Figure 2:
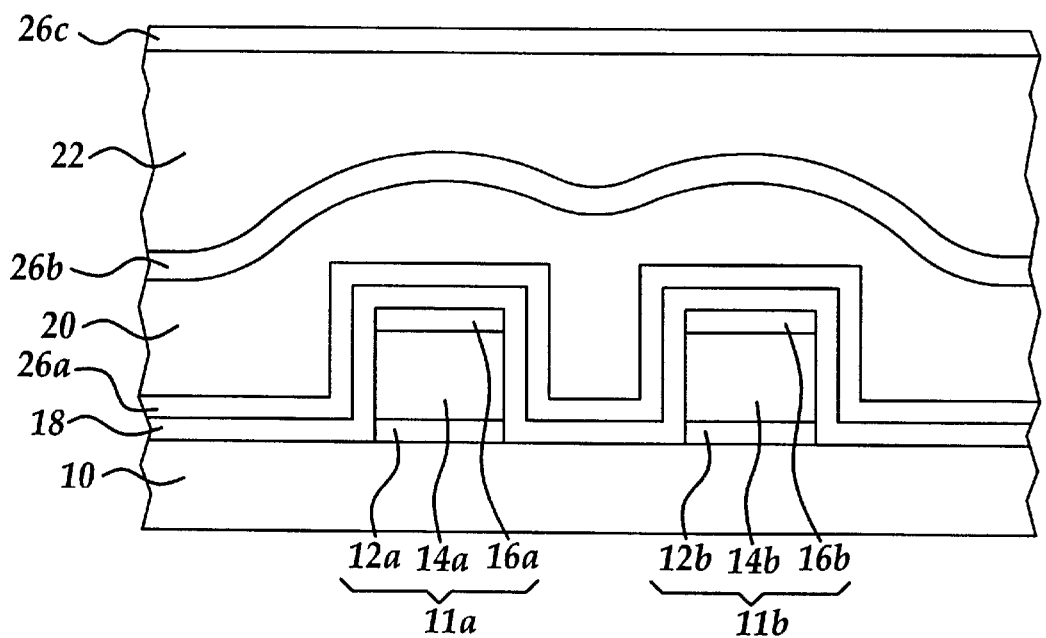

Referring now to FIG. 1 and FIG. 2, there is shown a pair of schematic cross-sectional diagrams directed towards a microelectronic fabrication fabricated in accord with a first preferred embodiment of the present invention.

Shown in FIG. 1 is a schematic cross-sectional diagram illustrating a microelectronic fabrication comprising in a first instance a substrate 10 having formed thereupon a pair of patterned conductor stack layers 11a and 11b.

Within the preferred embodiment of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the pair of patterned conductor stack layers 11a and 11b, the pair of conductor stack layers 11a and 11b is, as illustrated within the schematic cross-sectional diagram of FIG. 1, formed of a pair of patterned lower barrier layers 12a and 12b having formed aligned thereupon a pair of patterned conductor layers 14a and 14b having formed thereupon a pair of patterned upper barrier layers 16a and 16b.

Typically and preferably, the pair of patterned lower barrier layers 12a and 12b and the pair of patterned upper barrier layers 16a and 16b formed of barrier materials as are conventional in the art of microelectronic fabrication, including but not limited titanium, tantalum and tungsten barrier materials, alloys thereof and nitrides thereof. Typically and preferably, each of the pair of patterned lower barrier layers 12a and 12b and the pair of patterned upper barrier layers 16a and 16b is formed to a thickness of from about 200 to about 2000 angstroms.

Typically and preferably, the pair of patterned conductor layers 14a and 14b is similarly also formed employing methods and materials as are conventional in the art of microelectronic fabrication, including but not limited to aluminum, aluminum alloy, copper and copper alloy conductor materials. Typically and preferably, each of the pair of patterned conductor layers 14a and 14b is formed to a thickness of from about 2000 to about 10000 angstroms.

There is also shown within the schematic cross-sectional diagram of FIG. 1 formed upon exposed portions of the substrate 10 and the pair of patterned conductor stack layers 11a and 11b a blanket tri-layer silicon oxide dielectric stack layer 17 comprising: (1) a blanket conformal silicon oxide liner layer 18 formed upon exposed portions of the substrate 10 and the pair of patterned conductor stack layers 11a and 11b; (2) a blanket gap filling silicon oxide layer 20 formed upon the blanket conformal silicon oxide liner layer 18; and (3) a blanket capping silicon oxide dielectric layer 22 formed upon the blanket gap filling silicon oxide dielectric layer 20.

Within the microelectronic fabrication whose schematic cross-sectional diagram is illustrated in FIG. 1, each of the blanket conformal silicon oxide liner layer 18 and the blanket capping silicon oxide layer 22 is formed employing a chemical vapor deposition (CVD) method selected from the group consisting low pressure thermal chemical vapor deposition (LPCVD) methods and plasma enhanced chemical vapor deposition (PECVD) methods. The foregoing two chemical vapor deposition (CVD) methods will typically and preferably employ a reactor chamber pressure of from about 2 to about 5 torr, along with a silicon source material such as but not limited to silane or tetraethylorthosilicate (TEOS), in conjunction with an appropriate oxidant. Typically and preferably, the blanket conformal silicon oxide liner layer 18 is formed to a thickness of from about 200 to about 800 angstroms and the blanket capping silicon oxide layer 22 is formed to a thickness of from about 1000 to about 4000 angstroms.

Similarly, within the microelectronic fabrication whose schematic cross-sectional diagram is illustrated in FIG. 1, the blanket gap filling silicon oxide layer 20 is formed employing a method selected from the group consisting of sub-atmospheric chemical vapor deposition (SACVD) methods, atmospheric pressure chemical vapor deposition (APCVD) methods and spin-on methods. The foregoing two chemical vapor deposition (CVD) methods employ reactor chamber pressures of at least about 450 torr, typically with an ozone oxidant and a tetraethylorthosilicate (TEOS) silicon source material, in order to provide gap filling characteristics. When formed employing spin-on materials, the blanket gap filling silicon oxide layer 20 may be formed of silicate precursor spin-on materials or organo-siloxane precursor spin-on materials.

Within the first preferred embodiment of the present invention as illustrated within the schematic cross-sectional diagram of FIG. 1, none of the layers within the blanket tri-layer silicon oxide stack layer 17 is formed of a silicon and nitrogen containing dielectric material, and in particular a silicon nitride or a silicon oxynitride dielectric material.

Finally, as is also illustrated within the schematic cross-sectional diagram of FIG. 1, and as an unfortunate consequence as a spacing between the pair of patterned conductor stack layers 11a and 11b is generally reduced to less than about 0.4 microns, there is shown a crack 24 which extends through the blanket capping silicon oxide layer 22 and into the blanket gap filling silicon oxide layer 20.

It is towards the reduction and elimination of such cracks that the present invention is directed.

In order to effectuate that result, the present invention provides for forming at least: (1) interposed between the blanket conformal silicon oxide liner layer 18 and the blanket gap filling silicon oxide layer 20; (2) interposed between the blanket gap filling silicon oxide layer 20 and the blanket capping silicon oxide layer 22; or (3) upon the blanket capping silicon oxide layer 22, a stress reducing layer. Within the present invention, the stress reducing layer is formed of a silicon and nitrogen containing dielectric material. Typically and preferably the silicon and nitrogen containing dielectric material is selected from the group consisting of silicon nitride dielectric materials and silicon oxynitride dielectric materials. Similarly, typically and preferably, the stress reducing layer is formed as a conformal layer (i.e., single thickness layer) formed employing a chemical vapor deposition (CVD) method selected from the group including but not limited to, but more preferably consisting of, low pressure thermal chemical vapor deposition (LPCVD) methods and plasma enhanced chemical vapor deposition (PECVD) methods. Typically and preferably the stress reducing layer is formed to a thickness of from about 200 to about 1000 angstroms.

Thus, there is illustrated in FIG. 2 a schematic cross-sectional diagram of a microelectronic fabrication in accord with the first preferred embodiment of the present invention. The microelectronic fabrication whose schematic cross-sectional diagram is illustrated in FIG. 2 derives directly from the microelectronic fabrication whose schematic cross-sectional diagram is illustrated in FIG. 1.

As is illustrated within the microelectronic fabrication whose schematic cross-sectional diagram is illustrated in FIG. 2, there is formed at least one of: (1) a first stress reducing layer 26a interposed between the blanket conformal silicon oxide liner layer 18 and the blanket gap filling silicon oxide layer 20; (2) a second stress reducing layer 26b interposed between the blanket gap filling silicon oxide layer 20 and the blanket capping silicon oxide layer 22; and (3) a third stress reducing layer 26c formed upon the blanket capping silicon oxide layer 22.

In accord with the present invention, by employing at least one, or alternatively two or three, of the foregoing three stress reducing layers within the positions designated within the schematic cross-sectional diagram of FIG. 2, there is reduced or eliminated crack formation within the microelectronic fabrication whose schematic cross-sectional diagram is illustrated in FIG. 2, in comparison with the microelectronic fabrication whose schematic cross-sectional diagram is illustrated in FIG. 1.

As is further understood by a person skilled in the art, the first stress reducing layer 26a or the third stress reducing layer 26c may be formed in-situ upon the corresponding blanket conformal silicon oxide liner layer 18 or the corresponding blanket capping silicon oxide layer 22, within a continuous chemical vapor deposition (CVD) method, incident to initiating a nitrogen containing source material flow rate, as an adjunct with or in the alternative of an oxidant source material flow rate, further in conjunction with a silicon source material flow rate. The nitrogen containing source material may be selected from the group consisting of nitrogen and ammonia.

Second Preferred Embodiment

Figure 3:
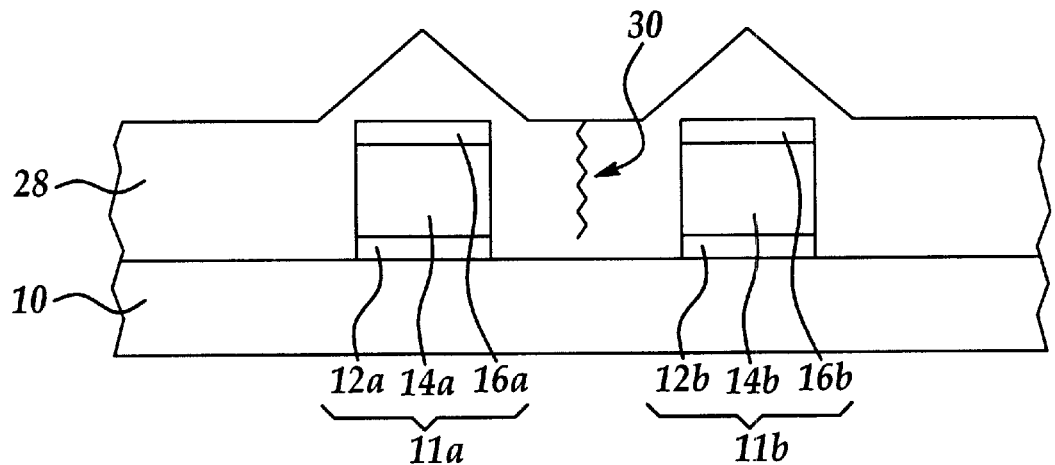
FIG. 3 and FIG. 4 show a pair of schematic cross-sectional diagrams directed towards a second preferred embodiment of the present invention.
Figure 4:
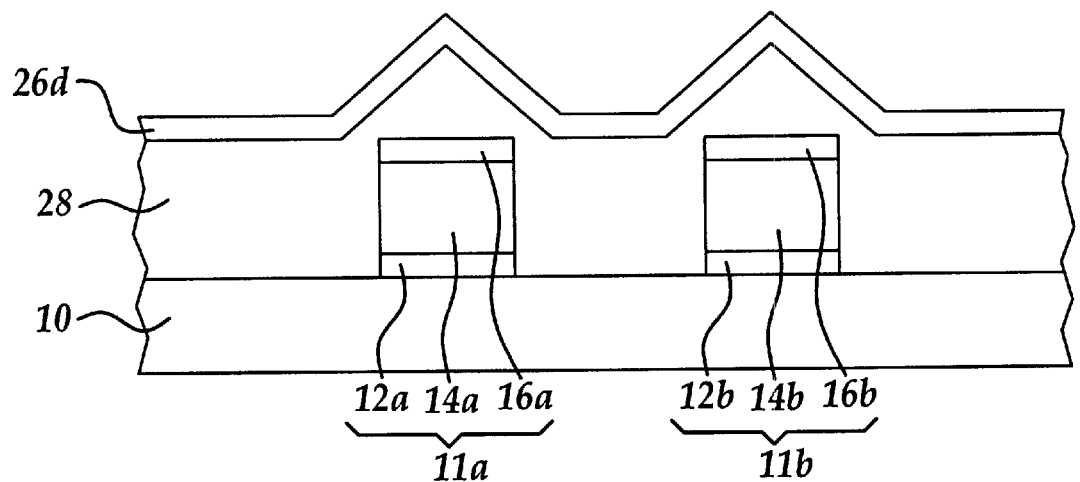

Referring now to FIG. 3 and FIG. 4, there is shown a pair of schematic cross-sectional diagrams directed towards a second preferred embodiment of the present invention.

Shown within the schematic cross-sectional diagram of FIG. 3, in a first instance, is a microelectronic fabrication analogous or equivalent to the microelectronic fabrication whose schematic cross-sectional diagram is illustrated in FIG. 1 and FIG. 2 with respect to the substrate 10 having formed thereupon the pair of patterned conductor stack layers 11a and 11b. However, within the second preferred embodiment of the present invention, rather than having formed upon the substrate 10 and the pair of patterned metal stack layers 11a and 11b the tri-layer dielectric stack layer 17 comprising the blanket conformal silicon oxide liner layer 18, having formed thereupon the blanket gap filling silicon oxide layer 20 in turn having formed thereupon the blanket capping silicon oxide layer 22 as illustrated within the schematic cross-sectional diagram of FIG. 1, there is instead formed a single blanket silicon oxide dielectric layer 28 as illustrated within the schematic cross-sectional diagram of FIG. 3. Within the second preferred embodiment of the present invention, the single blanket silicon oxide dielectric layer is a blanket passivation silicon oxide layer 28 formed employing a high density plasma chemical vapor deposition (HDP-CVD) method. As is understood by a person skilled in the art, and in accord with the schematic cross-sectional diagram of FIG. 3 in comparison with the schematic cross-sectional diagram of FIG. 1, the blanket passivation silicon oxide layer 28 is formed with gap filling characteristics rather than conformal (i.e., single thickness layer) characteristics.

As is understood by a person skilled in the art, a high density plasma chemical vapor deposition (HDP-CVD) method is a plasma enhanced chemical vapor deposition (PECVD) method which is further enhanced with a bias sputtering. Such methods are disclosed in greater detail within Ravi et al., in U.S. Pat. No. 5,976,993, as cited within the Description of the Related Art, all of which related art is incorporated herein fully by reference. In accord with the Description of the Related Art, and as is further understood by a person skilled in the art, such high density plasma chemical vapor deposition (HDP-CVD) methods provide particularly dense silicon oxide or low k dielectric layers, but, as illustrated within the schematic cross-sectional diagram of FIG. 3, they similarly also suffer from cracking, as illustrated by the crack 30 within blanket passivation silicon oxide layer 28 within the schematic cross-sectional diagram of FIG. 3.

Thus, within the context of the schematic cross-sectional diagram of FIG. 3, the second preferred embodiment of the present invention also provides a method for reducing or eliminating crack formation within a silicon oxide dielectric layer within a microelectronic fabrication. However, although the nature and location of the crack 30 are analogous with the nature and location of the crack 24 within the first preferred embodiment of the present invention, the physical structure of the silicon oxide layer is different insofar as the silicon oxide layer is formed employing a different method.

Analogously with the first preferred embodiment of the present invention, the second preferred embodiment of the present invention also employs for reducing or eliminating cracks within a silicon oxide dielectric layer a stress reducing layer of composition and thickness analogous or equivalent to the composition and thicknesses of the stress reducing layers 26a, 26b and 26c as illustrated within the schematic cross-sectional diagram of FIG. 2. However, within the second preferred embodiment of the present invention as is illustrated within the context of the schematic cross-sectional diagram of FIG. 4, a stress reducing layer 26d is formed upon the high density plasma chemical vapor deposition (HDP-CVD) deposited blanket passivation silicon oxide or low k layer 28.

As is further understood by a person skilled in the art, the blanket stress reducing layer 26d as illustrated within the schematic cross-sectional diagram of FIG. 4 may be formed in-situ upon the blanket passivation dielectric layer 28 while employing chemical vapor deposition methods including but not limited to low pressure thermal chemical vapor deposition (LPCVD) methods, plasma enhanced chemical vapor deposition (PECVD) methods and high density plasma chemical vapor deposition (HDP-CVD) methods, by appropriate introduction of a nitrogen source material flow.

As is understood by a person skilled in the art, the preferred embodiments of the present invention are illustrative of the present invention rather than limiting of the present invention. Revisions and modifications may be made to methods, materials, structures and dimensions through which is provided a microelectronic fabrication in accord with the preferred embodiments of the present invention, while still providing a method for fabricating a microelectronic fabrication in accord with the present invention, further in accord with the accompanying claims.

What is claimed is:

1. A method for fabricating a microelectronic fabrication comprising:

providing a substrate;

forming upon the substrate a pair of horizontally spaced topographic features;

forming upon exposed portions of the substrate and the pair of horizontally spaced topographic features a conformal silicon oxide liner layer formed employing a chemical vapor deposition method selected from the group consisting of low pressure thermal chemical vapor deposition methods and plasma enhanced chemical vapor deposition methods;

forming over the conformal silicon oxide liner layer a gap filling silicon oxide layer formed employing a method selected from the group consisting of sub-atmospheric chemical vapor deposition methods, atmospheric pressure chemical vapor deposition methods and spin-on methods;

forming over the gap filling silicon oxide layer a capping silicon oxide layer formed employing a chemical vapor deposition method selected from the group consisting of low pressure thermal chemical vapor deposition methods and plasma enhanced chemical vapor deposition methods; and forming at least either:
   (1) interposed between the conformal silicon oxide liner layer and the gap filling silicon oxide layer;
   (2) interposed between the gap filling silicon oxide layer and the capping silicon oxide layer; and
   (3) upon the capping silicon oxide layer, at least one stress reducing layer, wherein the at least one stress reducing layer is formed of a silicon and nitrogen containing dielectric material.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the pair of horizontally spaced topographic features is selected from the group consisting of conductor structures, semiconductor structures and dielectric structures.

4. The method of claim 1 wherein the silicon and nitrogen containing dielectric material is selected from the group consisting of silicon nitride dielectric materials and silicon oxynitride dielectric materials.

5. The method of claim 1 wherein the at least one stress reducing layer is formed employing a method selected from the group consisting of low pressure thermal chemical vapor deposition (LPCVD) methods and plasma enhanced chemical vapor deposition (PECVD) methods.

6. The method of claim 1 wherein the at least one stress reducing layer is formed to a thickness of from about 200 to about 1000 angstroms.

7. A method for fabricating a microelectronic fabrication comprising:

providing a substrate;

forming upon the substrate a pair of horizontally spaced topographic features;

forming upon exposed portions of the substrate and the pair of horizontally spaced topographic features a silicon oxide passivation layer formed employing a high density plasma chemical vapor deposition method; and forming upon the silicon oxide passivation layer a stress reducing layer formed of a silicon and nitrogen containing dielectric material formed to a thickness of from about 200 to about 1000 angstroms.

8. The method of claim 7 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

9. The method of claim 7 wherein the pair of horizontally spaced topographic features is selected from the group consisting of conductor structures, semiconductor structures and dielectric structures.

10. The method of claim 7 wherein the silicon and nitrogen containing dielectric material is selected from the group consisting of silicon nitride dielectric materials and silicon oxynitride dielectric materials.

11. The method of claim 7 wherein the at least one stress reducing layer is formed employing a method selected from the group consisting of low pressure thermal chemical vapor deposition (LPCVD) methods and plasma enhanced chemical vapor deposition (PECVD) methods.

12. A method for fabricating a microelectronic fabrication comprising:

providing a substrate;

forming upon the substrate a pair of horizontally spaced topographic features;

forming upon exposed portions of the substrate and the pair of horizontally spaced topographic features a conformal silicon oxide liner layer formed employing a chemical vapor deposition method selected from the group consisting of low pressure thermal chemical vapor deposition methods and plasma enhanced chemical vapor deposition methods;

forming over the conformal silicon oxide liner layer a gap filling silicon oxide layer formed employing a method selected from the group consisting of sub-atmospheric chemical vapor deposition methods, atmospheric pressure chemical vapor deposition methods and spin-on methods;

forming over the gap filling silicon oxide layer a capping silicon oxide layer formed employing a chemical vapor deposition method selected from the group consisting of low pressure thermal chemical vapor deposition methods and plasma enhanced chemical vapor deposition methods; and forming upon the capping silicon oxide layer a stress reducing layer, wherein the stress reducing layer is formed of a silicon and nitrogen containing dielectric material.

13. The method of claim 12 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

14. The method of claim 12 wherein the pair of horizontally spaced topographic features is selected from the group consisting of conductor structures, semiconductor structures and dielectric structures.

15. The method of claim 12 wherein the silicon and nitrogen containing dielectric material is selected from the group consisting of silicon nitride dielectric materials and silicon oxynitride dielectric materials.

16. The method of claim 12 wherein the stress reducing layer is formed employing a method selected from the group consisting of low pressure thermal chemical vapor deposition (LPCVD) methods and plasma enhanced chemical vapor deposition (PECVD) methods.

17. The method of claim 12 wherein the stress reducing layer is formed to a thickness of from about 200 to about 1000 angstroms.

* * * * *